United States Patent
Kumar et al.

(10) Patent No.: US 7,332,947 B2
(45) Date of Patent: Feb. 19, 2008

(54) METHOD AND APPARATUS FOR DISTORTING DUTY CYCLE OF A CLOCK

(75) Inventors: Arvind Kumar, Brookline, MA (US); Narayanan Natarajan, Shrewsbury, MA (US); Mahalingam Nagarajan, Grafton, MA (US)

(73) Assignee: Intel Corporation, Santa Clara, CA (US)

( * ) Notice: Subject to any disclaimer, the term of this patent is extended or adjusted under 35 U.S.C. 154(b) by 199 days.

(21) Appl. No.: 11/082,142

(22) Filed: Mar. 15, 2005

(65) Prior Publication Data

US 2006/0208781 A1 Sep. 21, 2006

(51) Int. Cl.
*H03L 7/06* (2006.01)

(52) U.S. Cl. .......................................... 327/150; 331/17

(58) Field of Classification Search ........ 327/148–149, 327/150, 157–158, 159; 331/17, 25; 375/373–376
See application file for complete search history.

(56) References Cited

U.S. PATENT DOCUMENTS 6,326,852 B1 * 12/2001 Wakayama ................... 331/17
7,184,510 B2 * 2/2007 Jung ........................... 375/374

OTHER PUBLICATIONS

Garlepp, Bruno W, et al., "A Portable Digital DLL for High-Speed CMOS Interface Circuits," *IEEE J. of Solid-State Circuits*, vol. 34, No. 5, May 1999, pp. 632-644.
Lee, Thomas H., et al., "A 2.5 V CMOS Delay-Locked Loop for an 18 Mbit, 500 Megabyte/s DRAM," *IEEE J. of Solid-State Circuits*, vol. 12, Dec. 1994, pp. 1491-1496.

* cited by examiner

*Primary Examiner*—Kenneth B. Wells
*Assistant Examiner*—Thomas J. Hiltunen
(74) *Attorney, Agent, or Firm*—Blakely, Sokoloff, Taylor & Zafman LLP

(57) ABSTRACT

An apparatus for controllably distorting the duty cycle of a clock signal is disclosed. Methods and systems using embodiments of the invention are also described.

8 Claims, 8 Drawing Sheets

US 7,332,947 B2

METHOD AND APPARATUS FOR DISTORTING DUTY CYCLE OF A CLOCK

BACKGROUND

An embodiment of the invention is directed at the control of one or more clocks under which electronic circuits operate. These clocks provide a way for events affecting (or caused by) the circuit to be sequenced reliably. For example, digital circuits such as microprocessors, digital signal processors and memories rely on clocks to synchronize and drive their operations.

One long-standing trend in the development of electronic circuits is the increase in clock speeds; another is the increase in the size of electronic circuits relative to the size of the components that make up the circuit. Both of these trends increase the difficulty of providing stable, useful clock signals to all parts of the circuit (or system) that need them. Transmitting the multi-gigahertz clock signals used in modern circuits from one place in the system to another often results in degradation of the signals, so that (for example) a circuit designed to work with a 50% duty cycle clock might receive a 20% or 70% duty cycle clock. The degraded clock may cause deleterious effects ranging from increased power usage to unstable or incorrect circuit operation.

A number of techniques have been developed to stabilize or correct clock signal waveforms. For example, duty cycle correctors are described in *A portable digital DLL for high-speed CMOS interface circuits* by Garlepp et al. (IEEE Journal of Solid State Circuits, vol. 34, no. 5 (May 1999)) and *A 2.5 V CMOS delay-locked loop for* 18 Mbit, 500 *megabyte/s DRAM* by T. H. Lee et al. (IEEE Journal of Solid State Circuits, vol. 29, no. 12 (December 1994)).

BRIEF DESCRIPTION OF DRAWINGS

Embodiments of the invention are illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

DETAILED DESCRIPTION OF DRAWINGS

Figure 1:
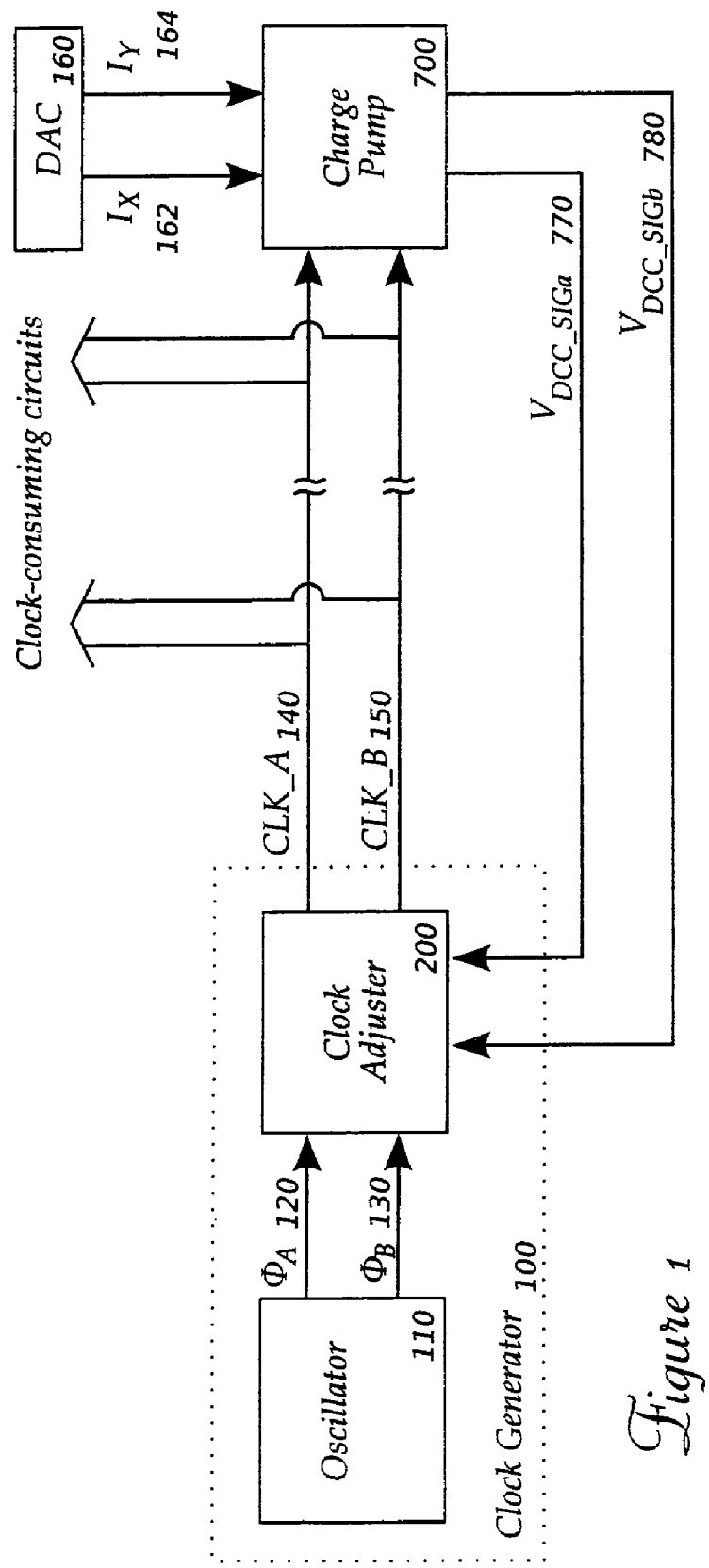
FIG. 1 shows a clock generator and duty cycle distorter connected in a feedback lop, according to an embodiment of the invention.

FIG. 1 shows a clock generator and duty cycle distorter according to an embodiment of the invention. The elements shown produce, monitor, and adjust a differential clock (signals CLK_A 140 and CLK_B 150). The clock may also be used by circuits not shown in the figure (as suggested by the notation "clock-consuming circuits"). The clock generator and duty cycle distorter include oscillator 110, clock adjuster 200, and charge pump 700 connected in a feedback loop so that oscillator signals $\phi_A$ 120 and $\phi_B$ 130 can be adjusted to produce signals CLK_A 140 and CLK_B 150 under the control of feedback signals $V_{DCC\_SIGa}$ 770 and $V_{DCC\_SIGb}$ 780. Oscillator 110 and clock adjuster 200 together form clock generator 100, which produces a differential clock with its duty cycle regulated according to analog feedback signals $V_{DCC\_SIGa}$ and $V_{DCC\_SIGb}$. The differential clock may be transmitted to clock-consuming circuits as shown, e.g., as part of a clock distribution tree.

Charge pump 700 produces feedback signals $V_{DCC\_SIGa}$ and $V_{DCC\_SIGb}$ based upon the duty cycle of CLK_A 140 and CLK_B 150 and variable currents $I_X$ 162 and $I_Y$ 164 from n-bit digital-to-analog converter ("DAC") current source 160. The details of the operation of charge pump 700 and the effect of variable currents $I_X$ 162 and $I_Y$ 164 on its outputs are discussed in greater detail below using an example.

Figure 2:
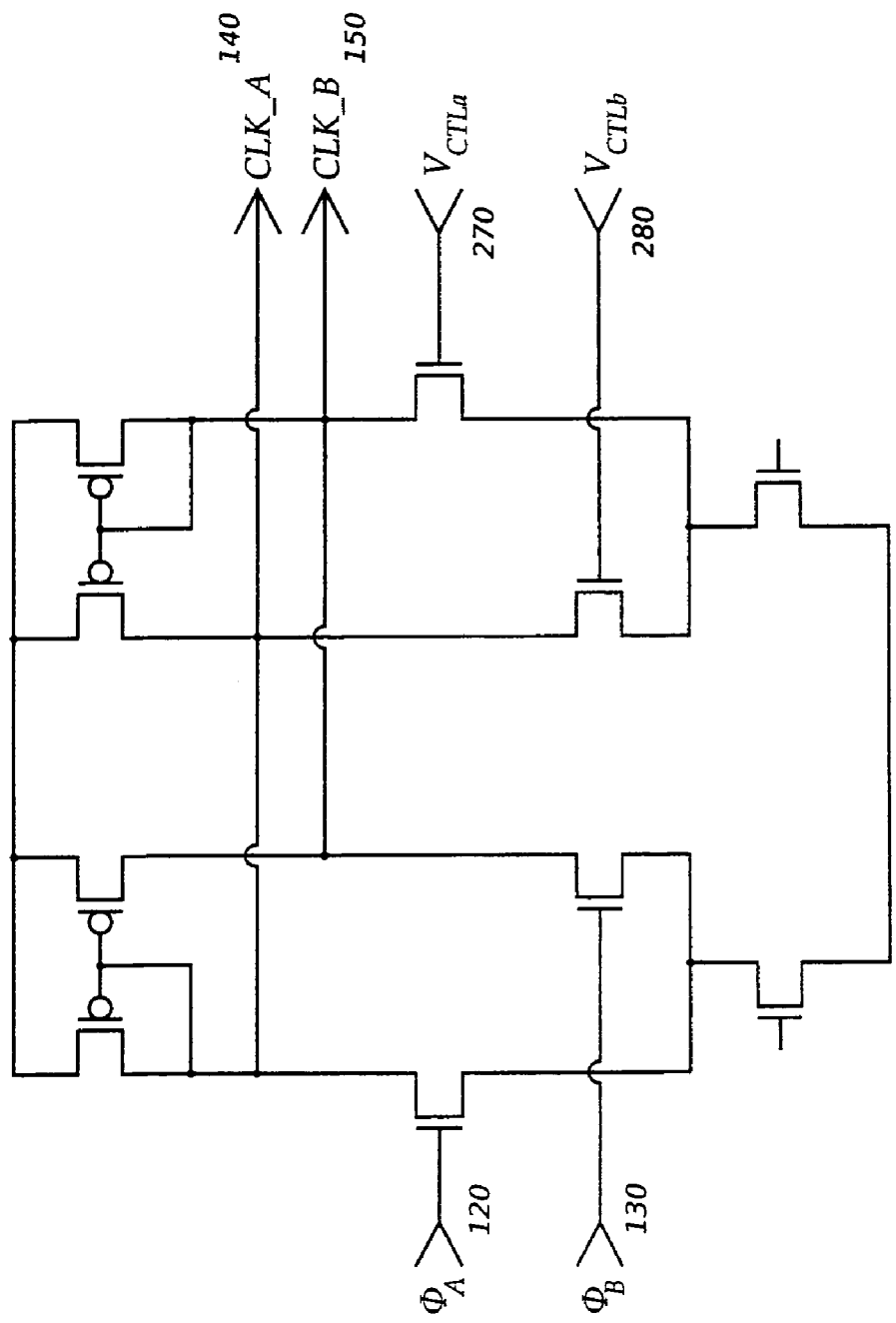
FIG. 2 shows a current comparator that can be used to adjust the duty cycle of an input clock.

The functions of clock adjuster 200, depicted in FIG. 1, can be performed by a circuit such as the one shown in FIG. 2. The circuit is a current comparator that can use control signals $V_{CTLa}$ 270 and $V_{CTLb}$ 280 to adjust the duty cycle of a raw differential clock such as $\phi_A$ 120 and $\phi_B$ 130 from an oscillator circuit (not shown). $V_{CTLa}$ 270 and $V_{CTLb}$ 280 adjust the trip point of the current comparator so that $\phi_A$ 120 and $\phi_B$ 130 become CLK_A 140 and CLK_B 150, a differential clock which has a duty cycle controlled by the control signals. Other circuits could also perform the clock adjustment of FIG. 1's element 200.

Figure 3:
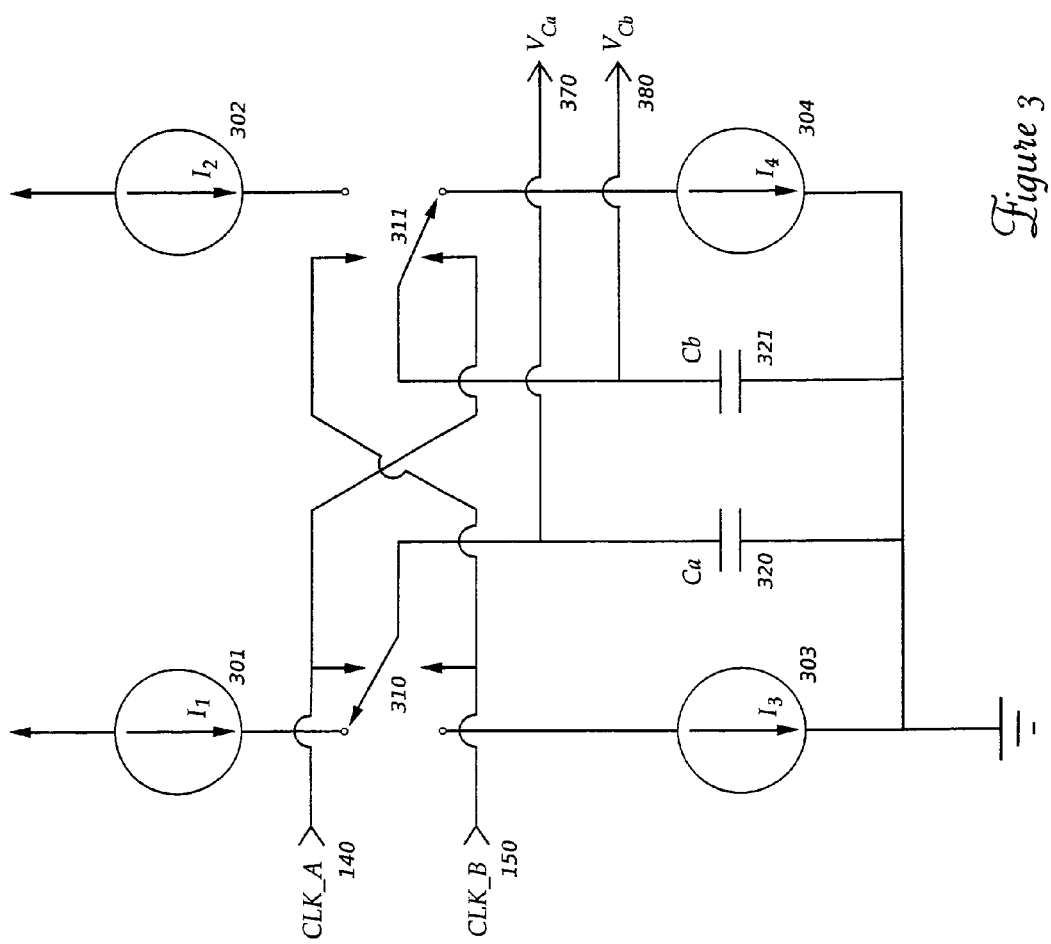
FIG. 3 shows a charge-pump circuit for detecting asymmetrical clock duty cycles.

Charge pump 700 shown in FIG. 1 may be based upon the circuit shown in FIG. 3. This circuit can be used to detect asymmetrical clock duty cycles. Current sources $I_1$ through $I_4$ (301, 302, 303 and 304) supply or remove charge from capacitors $C_a$ (320) and $C_b$ (321) through switches 310 and 311, which are controlled by a differential clock (CLK_A 140 and CLK_B 150). In one phase of the clock, $C_a$ 320 charges from $I_1$, while $C_b$ 321 discharges to $I_4$. In another phase, $C_a$ 320 discharges to $I_3$, while $C_b$ 321 charges from $I_2$. The charge pump produces signals $V_{Ca}$ 370 and $V_{Cb}$ 380 as the voltages across $C_a$ 320 and $C_b$ 321, respectively.

Figure 4:
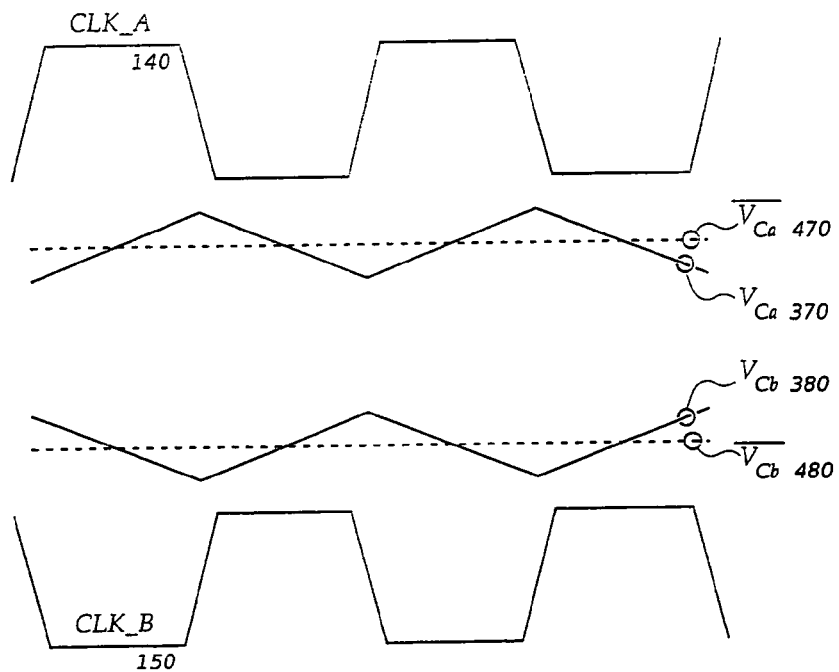
FIGS. 4 and 5 show examples of the time-correlation of several signals in the circuit of FIG. 3.
Figure 5:
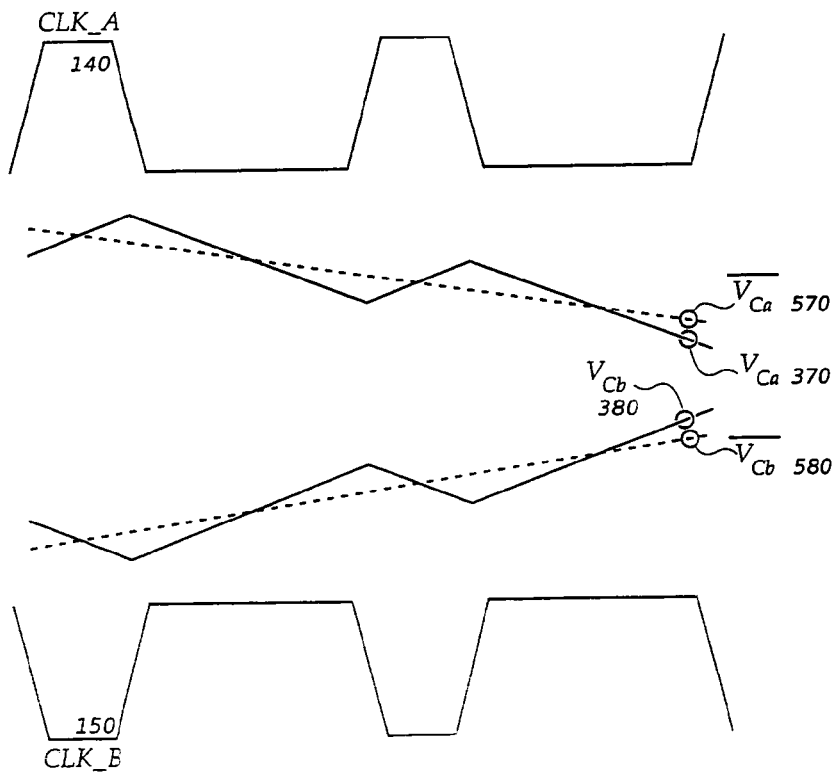

When the basic charge pump circuit of FIG. 3 is provided with a 50% duty cycle differential clock, its outputs $V_{Ca}$ and $V_{Cb}$ will produce signals similar to those shown in FIG. 4. There, example waveforms showing the relationship between the phases of differential clocks CLK_A 140 and CLK_B 150, the instantaneous voltages across each capacitor ($V_{Ca}$ 370 and $V_{Cb}$ 380), and the average voltages across each capacitor ($\overline{V_{Ca}}$ and $\overline{V_{Cb}}$ 480) are plotted. If all the current sources are the same and the capacitors are equal, then the difference between average voltages at $V_{Ca}$ and $V_{Cb}$ will remain constant when the clock duty cycle is 50%. If the clock becomes distorted so that one phase is longer than the other, the difference between average voltages $\overline{V_{Ca}}$ and $\overline{V_{Cb}}$ will change, as shown in FIG. 5. In that figure, CLK_A 140 has a shortened duty cycle, while CLK_B 150 has a lengthened duty cycle. (The frequency, however, has not changed.) Because of the altered duty cycle, $C_a$ spends more time discharging than charging (see the instantaneous voltage $V_{Ca}$ 370), and the average value $\overline{V_{Ca}}$, 570, tends to decrease. In a complementary fashion, $C_b$ spends more time charging than discharging (instantaneous $V_{Cb}$ 380); and the average value $\overline{V_{Cb}}$, 580, tends to rise. The difference between $\overline{V_{Ca}}$ and $\overline{V_{Cb}}$ is proportional to the duty cycle distortion. Thus, the basic charge pump circuit of FIG. 3 analyzes the duty cycles of CLK_A and CLK_B and produces a signal that indicates how far the duty cycles are from a target value.

Note that the amplitudes of the sawtooth waveforms for $V_{Ca}$ and $V_{Cb}$ are greatly exaggerated for clarity in FIGS. 4 and 5. In a practical circuit, $C_a$ and $C_b$ should be large enough in relation to the current sources so that per-clock-cycle fluctuations in $V_{Ca}$ and $V_{Cb}$ do not cause instability in a current comparator circuit. In effect, the capacitors operate as a low-pass filter, so that the feedback signals are proportional to $\overline{V_{Ca}}$ and $\overline{V_{Cb}}$, and not to the rapidly-fluctuating $V_{Ca}$ and $V_{Cb}$. In other words, the low-pass filter reduces signal components at or above the frequency of the clock.

Figure 6:
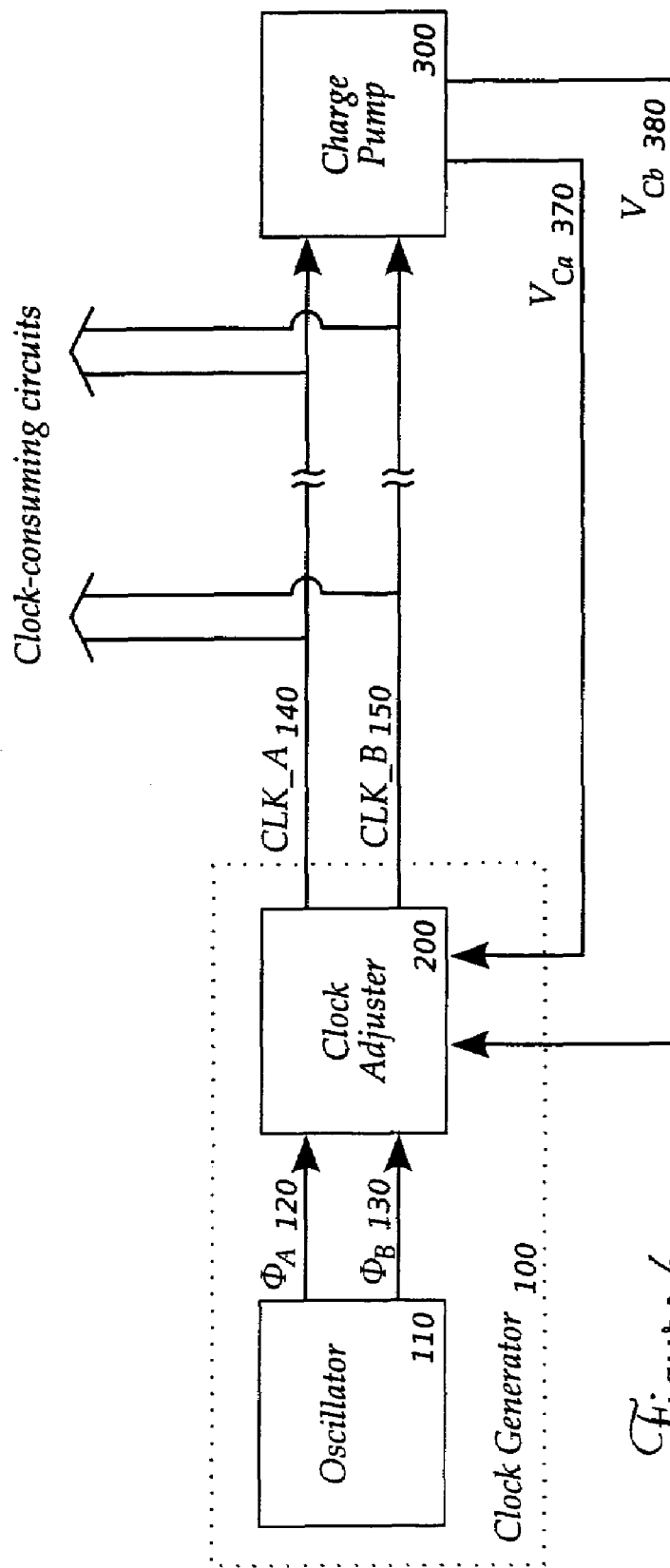
FIG. 6 shows a clock generator and duty cycle corrector connected in a feedback loop.

At equilibrium, a system such as that depicted in FIG. 6 where oscillator 110 produces signals $\phi_A$ 120 and $\phi_B$ 130; clock adjuster 200 produces adjusted signals CLK_A 140 and CLK_B 150; and charge pump 300 compares CLK_A 140 with CLK_B 150 and provides feedback signals $V_{Ca}$ 370 and $V_{Cb}$ 380; could be described by these equations:

$$\Delta V_{Ca} \propto I_1 \times t_a - I_3 \times t_b \qquad \text{Eq. 1}$$

$$\Delta V_{Cb} \propto I_2 \times t_b - I_4 \times t_a \qquad \text{Eq. 2}$$

where $\Delta V_{Ca}$ and $\Delta V_{Cb}$ are the change in voltage across $C_a$ and $C_b$, respectively, in one cycle; $t_a$ is the duration of the "A" phase of the clock and $t_b$ is the duration of the "B" phase of the clock (in this example, a two-phase clock). The current sources $I_1$-$I_4$ in the charge pump should be fabricated near to each other on the same semiconductor chip, and may be designed to mirror a single reference current $I_0$ (or a constant multiple of $I_0$). This provides a great degree of temperature, voltage, and frequency independence for the charge pump distortion detector. If all current sources are identical (e.g. $I_1=I_2=I_3=I_4=K \times I_0$) and the feedback circuit operates to ensure that $\Delta V_{Ca}=\Delta V_{Cb}$, then $t_a=t_b$ (in other words, CLK_A and CLK_B will operate at a 50% duty cycle).

If a fixed, non-symmetrical clock is desired, the values of the current sources can be made unequal so that the feedback signal causes the current comparator to produce the desired asymmetrical clock. For example, if $I_1=I_4=2 \times K \times I_0$ and $I_2=I_3=K \times I_0$, then the feedback circuit will ensure that $t_a=0.5\,t_b$ (33% duty cycle for CLK_A).

The clock duty cycle corrector described above with reference to FIG. 6 works well, but only clock distortions that can be detected by the charge pump can be corrected by the feedback loop. If another portion of the clock distribution tree on the same chip as the duty cycle corrector, or an off-chip component of the system, is adversely affected by clock distortion that is not detected, there is no way to incorporate an error signal proportional to that distortion into the feedback loop of FIG. 6. Embodiments of the present invention may be useful in addressing this shortcoming by incorporating a duty cycle distorter at the charge pump, as introduced in FIG. 1.

Figure 7:
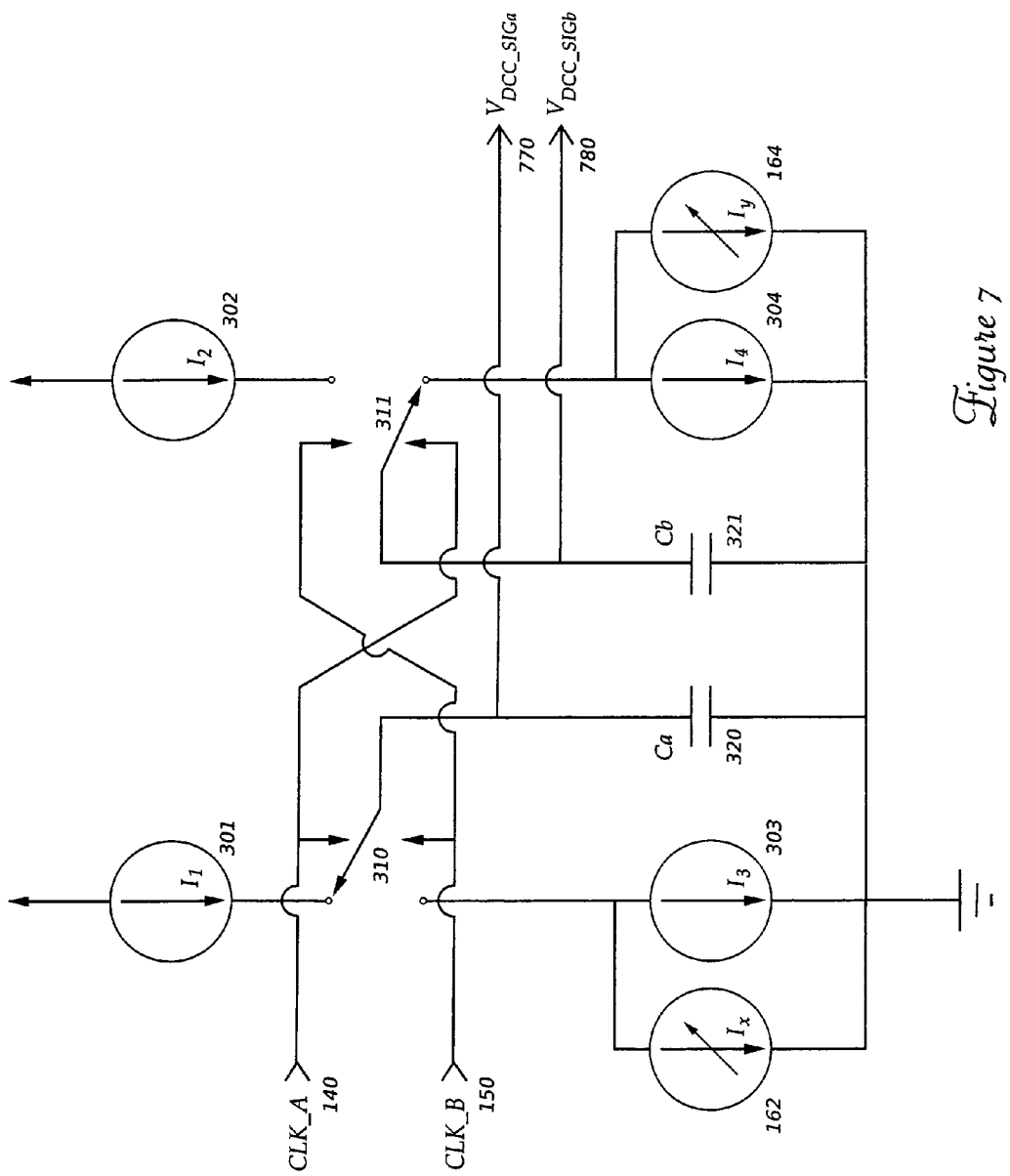
FIG. 7 shows a charge-pump circuit extended with an embodiment of the invention.

FIG. 7 shows the charge pump distortion detector of FIG. 3, augmented by variable current sources $I_X$ 162 and $I_Y$ 164, to form a duty cycle distorter according to an embodiment of this invention. $I_X$ and $I_Y$ should operate under the control of a DAC (see FIG. 1). An n-bit parameter applied to the DAC causes $I_X$ and $I_Y$ to transfer additional charge from $C_a$ 320 and $C_b$ 321 during one phase of the clock. Specifically, in the circuit depicted and for a two-phase clock, $I_X$ removes additional charge from $C_a$ during one phase, and $I_Y$ removes additional charge from $C_b$ during the other phase. Alternate embodiments are possible wherein the controllable current sources deliver additional charge (e.g., $I_X$ and $I_Y$ are placed in parallel with $I_1$ 301 and $I_2$ 302 instead of $I_3$ 303 and $I_4$ 304); or where additional charge can be transferred (delivered and removed) from only one of the capacitors. A less-favorable embodiment would deliver only one variable current to only one of the charge collectors. The currents transferred by $I_X$ and $I_Y$ may be smaller than those transferred by $I_1$ through $I_4$. The clock phases can be distorted over a useful range when $I_X$ and $I_Y$ can alter the current drawn from $C_a$ and $C_b$ over a range from about 50% of $I_1$ to 150% of $I_1$. Other ranges of operation are also possible.

When $I_X$ and $I_Y$ are not active (i.e. they are set to transfer zero charge), the circuit of FIG. 7 operates identically to that of FIG. 3, and the clock duty cycle is corrected as detected by and according to the feedback loop. For a differential clock, the currents drawn (or delivered) by $I_X$ and $I_Y$ should preferably be related as:

$$I_X = +\Delta I \qquad \text{Eq. 3}$$

$$I_Y = -\Delta I \qquad \text{Eq. 4}$$

where $|\Delta I| < 0.5 \times I_n$, $n \in \{1,2,3,4\}$. Then, the equilibrium equations described above become:

$$\Delta V_{Ca} \propto I_1 \times t_a - (I_3 + \Delta I) \times t_b \qquad \text{Eq. 5}$$

$$\Delta V_{Cb} \propto I_2 \times t_b - (I_4 - \Delta I) \times t_a \qquad \text{Eq. 6}$$

and the feedback circuit operating to keep $\Delta V_{Ca}=\Delta V_{Cb}$ will cause $$t_a \times (I_1 + I_4 - \Delta I) = t_b \times (I_2 - I_3 + \Delta I) \qquad \text{Eq. 7}$$

Assume a reference current $I_0 = I_1 = I_2 = I_3 = I_4$, then from Eq. 7, $$\text{Duty Cycle} = \frac{t_a}{t_a + t_b} = 0.5 \pm \frac{\Delta I}{I_0} \qquad \text{Eq. 8}$$

Current sources $I_X$ and $I_Y$ permit the equilibrium established by the feedback loop to be perturbed in a desired direction, resulting in a feedback signal that causes the clock adjuster to produce a distorted clock. For example, if $I_X$ and $I_Y$ are set to transfer more charge from $C_a$ than from $C_b$, then the charge pump feedback circuit will produce a signal identical to that produced if CLK_B's duty cycle had increased, and the feedback loop would operate to reduce CLK_B's duty cycle. However, since the detected increase in CLK_B's duty cycle was only apparent, and not a real increase, CLK_B's actual duty cycle would be reduced below that targeted by the unperturbed feedback circuit. Programmable current sources $I_X$ and $I_Y$ cause the charge pump to detect a phantom duty cycle distortion and produce a signal that causes the real duty cycle to be distorted in an opposite amount. $I_X$ and $I_Y$ permit the clock duty cycle to be adjusted under the control of a discrete integer-valued parameter applied to the DAC.

Furthermore, Equation 8 implies that control of clock duty cycle is linearly dependent on $$\frac{\Delta I}{I_0}.$$

If a DAC is configured so that the n-bit control word affects $I_X$ and $I_Y$ linearly, then the duty cycle of the clock can be adjusted linearly from one extreme to another according to that n-bit value. It is clear from Equation 8 that the duty cycle depends only on the ratio of currents $\Delta I$ and $I_0$, which can easily be set to a precise constant independent of the process, voltage, and temperature variations.

Instead of producing a charge pump with four fixed current sources and two variable, DAC-controlled current sources (which, furthermore, should ideally be capable of providing both positive and negative currents), a more practical circuit would contain two fixed, mirrored current sources and two DAC-controlled current sources that can be varied over a range from about $0.5 \times K \times I_{ref}$ to about $1.5 \times K \times I_{ref}$. In this practical circuit, setting the DAC to the middle of its range would cause the variable current sources to match the fixed current sources, while DAC settings above and below the midpoint would effectively permit positive and negative $\Delta I$ currents to be applied.

Figure 8:
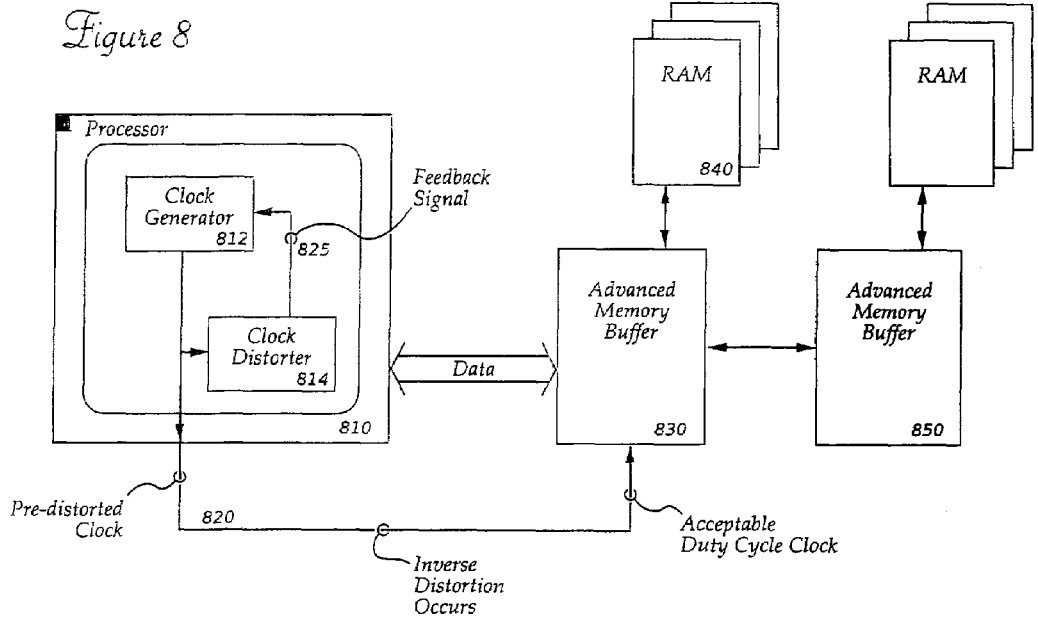
FIGS. 8 and 9 shows systems that can make use of a duty cycle distorter to adjust their clocks.

This precise numerical control over clock duty cycle may be useful in a system such as the one depicted in FIG. 8. There, processor 810, which may be a general purpose microprocessor such as the Tukwila microprocessor by Intel Corporation of Santa Clara, Calif., contains a clock generator circuit 812 and a clock distorter circuit 814 according to an embodiment of this invention, connected in a feedback loop 825. The distorter circuit monitors and controls the clock signals near the point where those signals are exported from the chip for use by other components in the system. The signals are transmitted over interconnect wires 820 to integrated circuit 830, which may be a system component such as an Advanced Memory Buffer ("AMB"). The AMB provides an interface between processor 810 and banks of random access memory ("RAM") 840 and/or other AMBs 850.

If the clock received at an AMB is distorted for any reason (e.g. sub-optimal circuit layout or manufacturing tolerance effects) so that the AMB fails to operate reliably, the clock cycle distorter 814 can be configured by programming a value into a current DAC in the charge pump circuit to pre-distort the clock to compensate for the distortion introduced elsewhere in the system. The amount and direction of pre-distortion is selected to counteract the external distortion, so that the clock arriving at the AMB 830 is within acceptable parameters. In other words, the pre-distortion is set to be the inverse or complement of the external distortion. This clock tuning capability can improve system operational margins or even restore failed systems to functionality.

Figure 9:
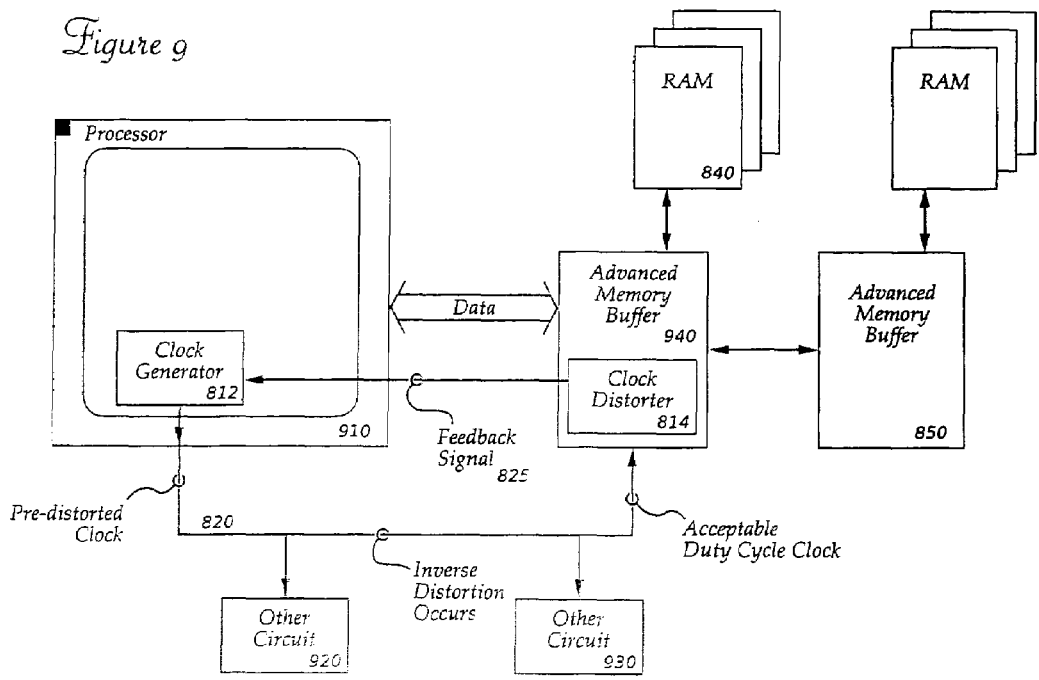

FIG. 9 shows another embodiment of the invention. Here, a first integrated circuit chip 910 contains a clock generator 812, and provides clock signals to other components 920, 930 in the system. A second integrated circuit chip 940 contains a clock distorter circuit 814. The second chip receives the clock signal and provides a feedback signal 825 to the clock generator on the first chip, aiding the generator to produce a clock that has an acceptable duty cycle at points within the system where the clock is used. This example shows that the clock generator and clock distorter circuits need not be integrated together in the same semiconductor die (although that arrangement is possible). In fact, the generator and distorter need not even be placed on the same circuit board.

Figure 10:
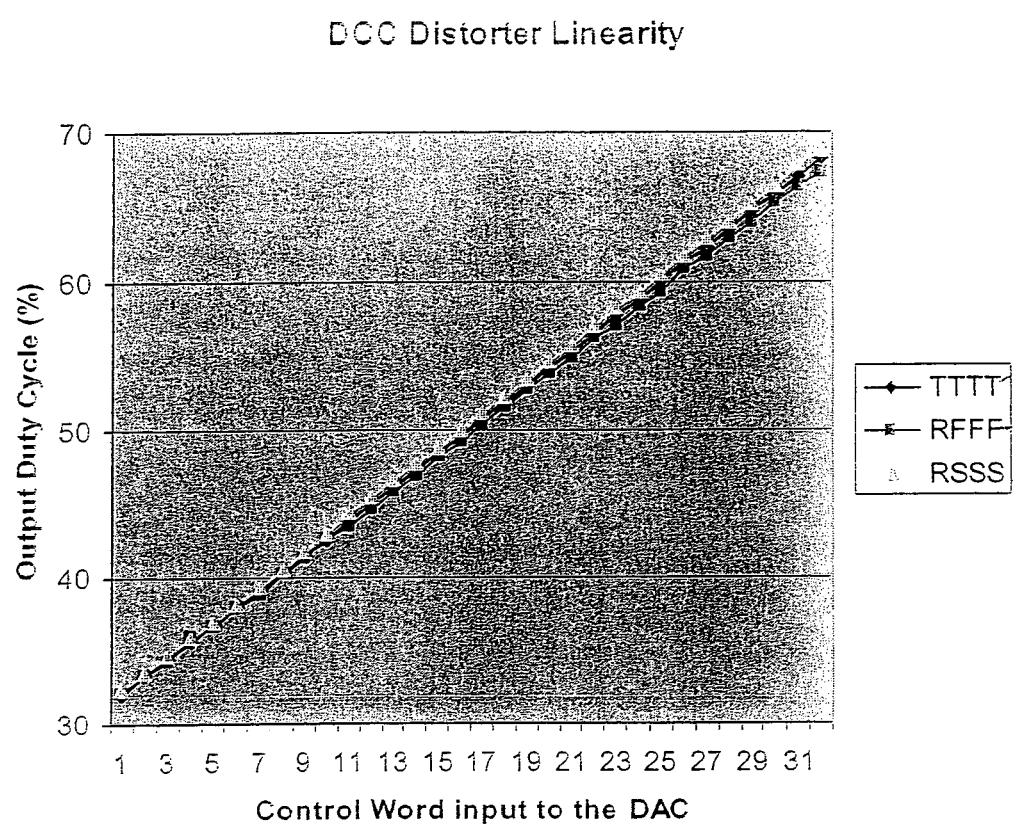
FIG. 10 shows the results of simulations of an embodiment of the invention.

In FIG. 10 the results of a simulated clock generator and distortion introducing feedback circuit according to an embodiment of the invention are presented. In the simulated circuit, a five-bit DAC was used to control current sources $I_X$ and $I_Y$ (thus, thirty two distinct values could be programmed into the DAC). The effect of the DAC control word on the dock duty cycle was plotted for simulation runs under nominal, realistic fast corner and realistic slow corner conditions. (Realistic fast and slow conditions were selected as $\pm 3$ standard deviations ($\pm 3\sigma$) from nominal device characteristics.) The graph shows that the duty cycle can be varied with almost perfect linearity under many realistic conditions; the duty cycle was dependent only on the control word input to the DAC and was thus largely independent of process, temperature, and supply voltage.

A duty cycle distorter according to an embodiment of the invention is not merely useful in testing applications. The duty cycle distorters can be fabricated on production integrated circuits and can improve circuit and system production yields by more easily compensating for board- and system-level distortion effects. Because the adjustment is digital (e.g. an n-bit binary value) and the induced distortions are largely fabrication process independent, it is easier and less expensive to correct for unanticipated clock degradation than, for example, by reworking parts or trimming analog adjusters in every individual production IC die. Rather, once a few, or even a single, example system has been tuned by adjusting the n-bit DAC control word, the same control word can be programmed into the other instances of the system to obtain the same properly-adjusted clock signals.

The embodiments of the invention have been described largely by reference to specific examples and in terms of particular allocations of functionality to certain hardware implementations. However, those of skill in the art will recognize that clock duty cycle distortion can also be accomplished by alternate electronic circuits that achieve the objectives of the invention in other ways. For example, the techniques described above can also be applied to distort a single-ended clock. Such alternative circuits are understood to be apprehended according to the following claims.

In the following claims, the phrases "delivering current" and "transferring charge" are explicitly defined to have the following meanings, without regard to a direction indicated by a preposition such as "to" or "from" that may follow them:

"Delivering current" refers to providing a path from one node in a circuit to another node in the circuit through which current may flow.

"Transferring charge" refers to increasing or decreasing the potential of a node in a circuit by delivering current to or from the node.

We claim:

1. An apparatus comprising:

a first charge collector and a second charge collector;

a first current source, a second current source and a third current source; and a digitally-controlled adjustable current source; wherein the first current source is to deliver current to the first charge collector and the second current source is to deliver current from the second charge collector on a first phase of a clock signal;

the third current source is to deliver current to the second charge collector and the digitally-controlled adjustable current source is to deliver current from the first charge collector on a second phase of the clock signal; and wherein a difference between a voltage across the first charge collector and a voltage across the second charge collector is used to alter a duty cycle of the clock signal, the duty cycle of the clock signal having a substantially linear relationship to a control word of the digitally-controlled adjustable current source.

2. The apparatus of claim 1 wherein there is a linear relationship between an adjustment of the digitally-controlled adjustable current source and the duty cycle of the clock signal.

3. The apparatus of claim 1 wherein the duty cycle of the clock is independent of an operating temperature and an operating voltage of the apparatus.

4. The apparatus of claim 1 wherein the first charge collector and the second charge collector operate as low-pass filters to attenuate signals at or above a frequency of the clock signal.

5. The apparatus of claim 1 wherein the first, second and third current sources mirror a constant multiple of a reference current.

6. The apparatus of claim 1 wherein the apparatus is integrated on a first substrate and a circuit to generate the clock signal is integrated on a second, separate substrate.

7. The apparatus of claim 1 wherein the duty cycle of the clock signal is independent of a process variation affecting the apparatus.

8. The apparatus of claim 1 wherein the apparatus is integrated on a first substrate and a circuit to generate the clock signal is integrated on the first substrate.

* * * * *

UNITED STATES PATENT AND TRADEMARK OFFICE
CERTIFICATE OF CORRECTION

PATENT NO. : 7,332,947 B2 Page 1 of 1
APPLICATION NO. : 11/082142
DATED : February 19, 2008
INVENTOR(S) : Kumar et al.

It is certified that error appears in the above-identified patent and that said Letters Patent is hereby corrected as shown below:

In column 1, at line 46, delete "lop" and insert --loop--.

In column 2, at line 52, after "$V_{ca}$", insert --470--.

In column 6, at line 16, remove "dock", and insert --clock--.

Signed and Sealed this

Second Day of September, 2008

JON W. DUDAS
*Director of the United States Patent and Trademark Office*